US009159457B2

(12) United States Patent
Yun

(10) Patent No.: US 9,159,457 B2
(45) Date of Patent: Oct. 13, 2015

(54) NON-VOLATILE MEMORY DEVICE FOR STORING WRITE DATA HAVING DIFFERENT LOGIC LEVELS

(75) Inventor: In-Suk Yun, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 308 days.

(21) Appl. No.: 13/474,917

(22) Filed: May 18, 2012

(65) Prior Publication Data

US 2013/0166823 A1 Jun. 27, 2013

(30) Foreign Application Priority Data

Dec. 22, 2011 (KR) .................. 10-2011-0140501

(51) Int. Cl.
*G06F 12/00* (2006.01)
*G11C 29/36* (2006.01)
*G11C 16/10* (2006.01)

(52) U.S. Cl.
CPC ............. *G11C 29/36* (2013.01); *G11C 16/10* (2013.01)

(58) Field of Classification Search
CPC .. G06F 3/0629; G06F 3/0656; G06F 13/1673
USPC .................. 711/154, 156, 167; 710/52, 310; 712/225, 248
See application file for complete search history.

(56) References Cited

U.S. PATENT DOCUMENTS 5,973,967 A * 10/1999 Nguyen et al. ........... 365/189.05
6,163,048 A * 12/2000 Hirose et al. ................ 257/315
7,310,275 B2 * 12/2007 Cha .......................... 365/189.05
2004/0085831 A1 * 5/2004 Cho et al. ..................... 365/200
2004/0240268 A1 * 12/2004 Kim et al. ................ 365/185.09
2006/0181924 A1 * 8/2006 Cha ............................ 365/185.12
2006/0224789 A1 * 10/2006 Cho et al. ....................... 710/52
2008/0291739 A1 * 11/2008 Lee et al. ................. 365/185.22
2009/0225611 A1 * 9/2009 Cha et al. ....................... 365/201
2010/0103743 A1 * 4/2010 Kim et al. ................ 365/185.25
2010/0202230 A1 8/2010 Rao
2010/0302851 A1 * 12/2010 Ryu ........................... 365/185.12
2010/0302860 A1 * 12/2010 Oh ............................. 365/185.19

(Continued)

FOREIGN PATENT DOCUMENTS

KR 1020050015293 2/2005

OTHER PUBLICATIONS

Bagatin et al., "Single Event Effects in 1Gbit 90nm NAND Flash Memories under Operating Conditions", 2007, IEEE, pp. 146-151.*

(Continued)

*Primary Examiner* — Reba I Elmore
(74) *Attorney, Agent, or Firm* — IP & T Group LLP

(57) ABSTRACT

A non-volatile memory device includes a plurality of bit lines; a plurality of page buffers corresponding to the bit lines, respectively, and configured to each store a write data; and a control circuit configured to control at least one page buffer of the plurality of page buffers to store the write data of a first logic level and control other ones of the plurality of page buffers to store the write data of a second logic level, wherein the control circuit is further configured to select the at least one page buffer based on an address inputted to the control circuit. Since write data of diverse patterns may be generated within a non-volatile memory device by using a portion of the bits of the address, a test operation of the non-volatile memory device may be performed within a short time.

8 Claims, 4 Drawing Sheets

(56) References Cited

U.S. PATENT DOCUMENTS

2011/0013457 A1* 1/2011 Han .................. 365/185.18
2012/0099387 A1* 4/2012 Shim et al. ............. 365/189.05
2012/0230103 A1* 9/2012 Choe et al. ............. 365/185.2
2012/0320675 A1* 12/2012 Kang ..................... 365/185.03

OTHER PUBLICATIONS

Takeuchi et al., "A 56-nm CMOS 99-mm2 8-Gb Multi-Level NAND Flash Memory With 10-Mb/s Program Throughput", Jan. 2007, IEEE vol. 42, No. 1, pp. 219-232.*

* cited by examiner

NON-VOLATILE MEMORY DEVICE FOR STORING WRITE DATA HAVING DIFFERENT LOGIC LEVELS

CROSS-REFERENCE TO RELATED APPLICATIONS

The present application claims priority of Korean Patent Application No. 10-2011-0140501, filed on Dec. 22, 2011, which is incorporated herein by reference in its entirety.

BACKGROUND

1. Field

Exemplary embodiments of the present invention relate to a non-volatile memory device.

2. Description of the Related Art

As the integration degree of a non-volatile memory device, such as a flash memory device, increases, additional costs and time are spent in testing a non-volatile memory device.

An exemplary operation of programming a test data in a memory cell (not shown) during a test operation of a non-volatile memory device is performed as follows. For illustration purposes, it is assumed that a non-volatile memory device includes N page buffers and N bit lines.

Each of the N page buffers receives and stores a test data that is inputted from an external device. The test data stored in the respective N page buffers are loaded onto N bit lines, respectively, and programmed in N memory cells that are coupled with the N bit lines. When a test operation is performed in the general program operation, the test data is inputted from an external device and thus, the test operation takes additional time.

To reduce the test time, the process of receiving a test data from an external device may be obviated, by generating a test data internally and storing the test data in a page buffer. This method will be described in detail with reference to FIG. 1.

FIG. 1 illustrates a conventional non-volatile memory device. The non-volatile memory device may include N bit lines BL1 to BLN, N page buffers 10_1 to 10_N, and N data controllers 20_1 to 20_N.

Each of the N page buffers 10_1 to 10_N stores a write data, which means a data to be programmed in a memory cell (not shown).

Each of the N data controllers 20_1 to 20_N corresponds to the N page buffers 10_1 to 10_N, respectively. When a reset signal RST is activated, each of the N data controllers 20_1 to 20_N controls the corresponding page buffer to store the write data of a logic high level. When a set signal SET is activated, each of the N data controllers 20_1 to 20_N controls the corresponding page buffer to store the write data of a logic low level.

During the test operation of the non-volatile memory device illustrated in FIG. 1, an operation of generating write data of a pattern and programming the write data in memory cells (not shown) is performed as follows.

The reset signal RST is enabled to a logic high level in the initial duration of the test operation. Each of the N data controllers 20_1 to 20_N controls the corresponding page buffer to store the write data of a logic high level in response to the reset signal RST of a logic high level. As a result, a high level write data is loaded on the latch node QC of each of the N page buffers 10_1 to 10_N. The write data loaded on the latch node QC of each of the N page buffers 10_1 to 10_N is applied to a memory cell (not shown) through a bit line. According to an example, a data of '11111111 . . . ' is programmed in N memory cells (not shown).

Meanwhile, when the set signal SET is enabled to a logic high level in the initial duration of the test operation, a write data of a logic low level is loaded on the latch node QC of each of the N page buffers 10_1 to 10_N. According to an example, a data of '00000000 . . . ' is programmed in N memory cells (not shown).

However, when the test operation is performed as described above, the pattern of the test data that are programmed in memory cells (not shown) is limited to '11111111 . . . ' or '00000000 . . . '.

SUMMARY

An embodiment of the present invention is directed to a non-volatile memory device that may internally generate test data of diverse patterns.

In accordance with an embodiment of the present invention, a non-volatile memory device includes: a plurality of bit lines; a plurality of page buffers corresponding to the bit lines, respectively, and configured to each store a write data; and a control circuit configured to control at least one page buffer of the plurality of page buffers to store the write data of a first logic level and control other ones of the plurality of page buffers to store the write data of a second logic level, wherein the control circuit is further configured to select the at least one page buffer based on an address inputted to the control circuit.

In accordance with another embodiment of the present invention, a non-volatile memory device includes: a plurality of bit lines; a plurality of page buffers corresponding to the plurality of bit lines, respectively, and configured to each store a write data; and a control circuit configured to control at least one page buffer of the plurality of page buffers to store the write data of a first logic level and control other ones of the plurality of page buffers to store the write data of a second logic level, wherein the control circuit is further configured to select the at least one page buffer based on a portion of bits of an address consisting of multiple bits.

DETAILED DESCRIPTION

Figure 1:
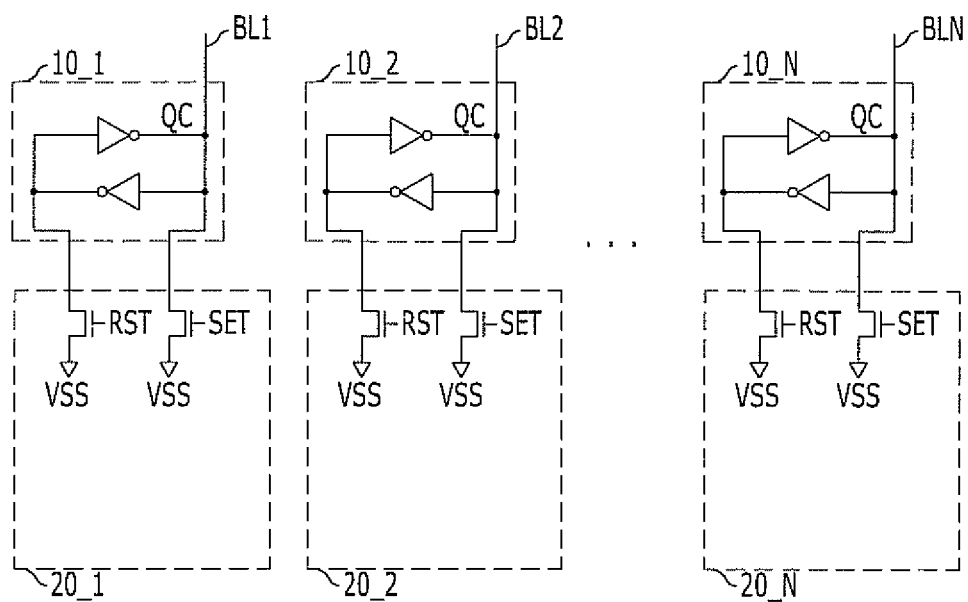
FIG. 1 illustrates a conventional non-volatile memory device.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 2:
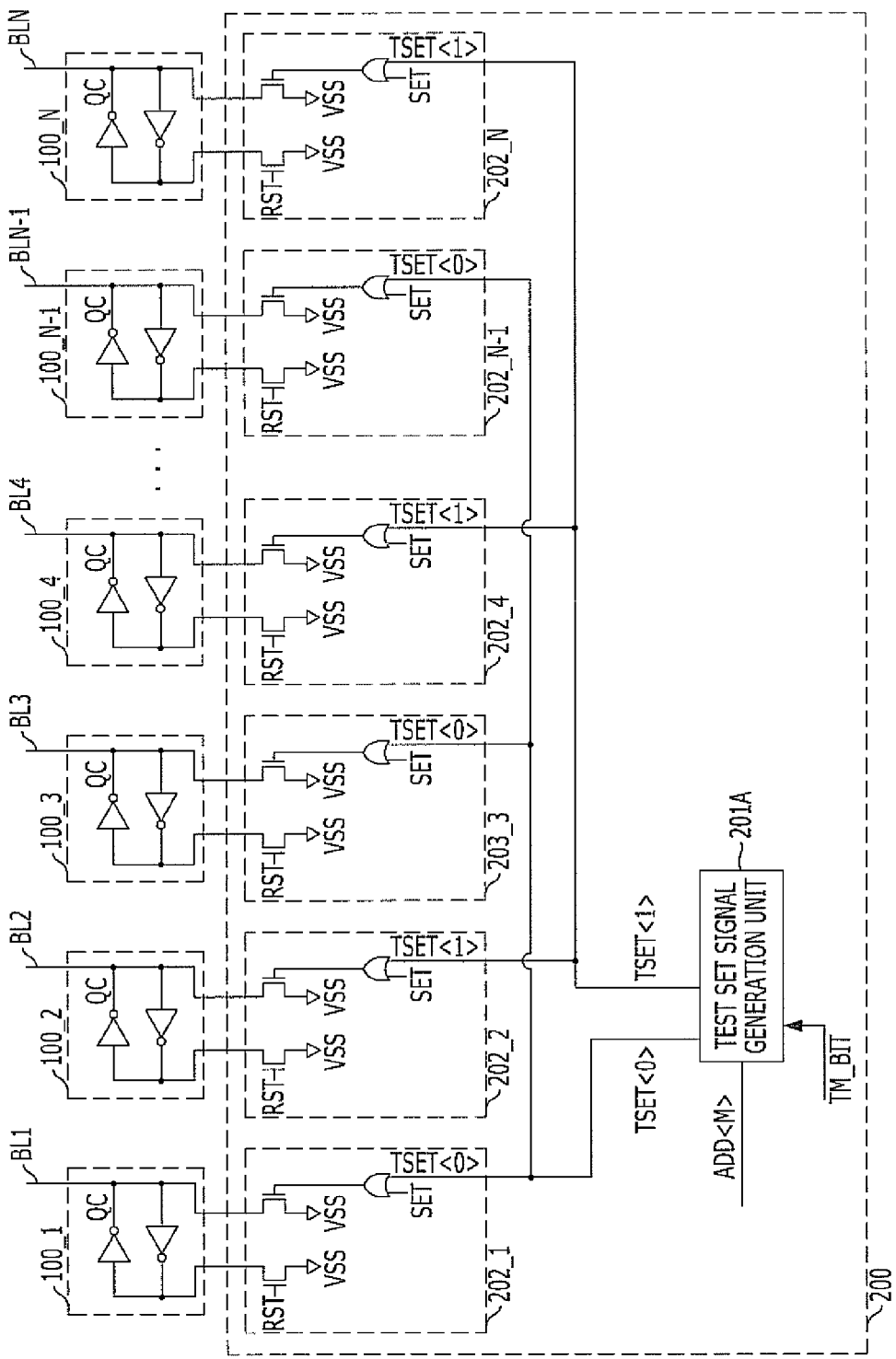
FIG. 2 illustrates a non-volatile memory device in accordance with an embodiment of the present invention.

FIG. 2 illustrates a non-volatile memory device in accordance with an embodiment of the present invention.

The non-volatile memory device may include N bit lines BL1 to BLN, N page buffers 100_1 to 100_N, and a control circuit 200.

Each of the N bit lines BL1 to BLN is coupled with a memory cell (not shown). The write data respectively loaded on the N bit lines BL1 to BLN are programmed in respective memory cells (not shown).

The N page buffers 100_1 to 100_N correspond to the N bit lines BL1 to BLN, respectively, and store write data. During a program operation, each of the N page buffers 100_1 to 100_N transfers a write data to a bit line coupled to itself.

The control circuit 200 controls page buffers selected based on some address bits (for example, ADD<M>) of an address ADD<1:M> to store a write data of a first logic level among the N page buffers 100_1 to 100_N and controls the other page buffers to store a write data of a second logic level. The write data of the first logic level may be a data of a logic low level, and the write data of the second logic level may be a data of a logic high level. Alternatively, the write data of the first logic level may be a data of a logic high level, and the write data of the second logic level may be a data of a logic low level. The number of page buffers selected by the address bit ADD<M> of the address ADD<1:M> is at least one. For illustration purposes, FIG. 2 shows a case where the control circuit 200 selects odd-numbered page buffers 100_2K−1, where 1≤K≤N/2, or even-numbered page buffers 100_2K among the N page buffers 100_1 to 100_N based on an $M^{th}$ address bit ADD<M>. To be specific, the control circuit 200 may be designed to select odd-numbered page buffers 100_2K−1, where 1≤K≤N/2, and store data of a logic low level in the selected odd-numbered page buffers 100_2K−1, where 1≤K≤N/2, and store data of a logic high level in the even-numbered page buffers 100_2K, when the $M^{th}$ address bit ADD<M> of the address ADD<1:M> is in a logic high level. Alternatively, the control circuit 200 may be designed to select even-numbered page buffers 100_2K, where 1≤K≤N/2, and store data of a logic low level in the selected even-numbered page buffers 100_2K, where 1≤K≤N/2, and store data of a logic high level in the odd-numbered page buffers 100_2K−1, when the $M^{th}$ address bit ADD<M> of the address ADD<1:M> is in a logic low level.

The control circuit 200 may include a test set signal generation unit 201A and N data control units 202_1 to 202_N.

The test set signal generation unit 201A generates first and second test set signals TSET<0:1>, and when a test signal TM_BIT is enabled, the test set signal generation unit 201A decodes the $M^{th}$ address bit ADD<M> of the address ADD<1:M> to enable any one between the first test set signal TSET<0> and the second test set signal TSET<1>. Here, the test signal TM_BIT is a signal representing a test mode or a normal mode. To be specific, when the test signal TM_BIT is in a logic high level, the test signal TM_BIT may represent a test mode. When the test signal TM_BIT is in a logic low level, the test signal TM_BIT may represent a normal mode. The test set signal generation unit 201A may be designed to decode the $M^{th}$ address bit ADD<M> of the address ADD<1:M> and generate the first and second test set signals TSET<0:1> as shown in Table 1 in the test mode, where the test signal TM_BIT is in a logic high level in the test mode.

TABLE 1

Example of first and second test set signals TSET<0:1> that are generated by decoding one address bit ADD <M>

| ADD<M> | TSET<0> | TSET<1> |
|---|---|---|
| 0 | 0 | 1 |
| 1 | 1 | 0 |

When the $M^{th}$ address bit ADD<M> of the address ADD<1:M> is in a logic high level in the test mode, where the test mode is indicated by the test signal TM_BIT being in a logic high level, the test set signal generation unit 201A may be designed to generate the first test set signal TSET<0> of a logic high level and the second test set signal TSET<1> of a logic low level. Also, when the $M^{th}$ address bit ADD<M> of the address ADD<1:M> is in a logic low level in the test mode, the test set signal generation unit 201A may be designed to generate the first test set signal TSET<0> of a logic low level and the second test set signal TSET<1> of a logic high level.

Meanwhile, the test set signal generation unit 201A may be designed to perform the operation to generate and enable the first and second test set signals TSET<0:1> as shown in Table 1 in the test mode. Further, the test set signal generation unit 201A may be designed to generate the first and second test set signals TSET<0:1> of a logic low level in the normal mode, which is indicated by the test signal TM_BIT being in a logic low level.

The N data control units 202_1 to 202_N correspond to the N page buffers 100_1 to 100_N, respectively, and control the level of the write data stored in the corresponding N page buffers 100_1 to 100_N. To be specific, when a reset signal RST is enabled, each of the N data control units 202_1 to 202_N controls a corresponding page buffer to store the write data of the second logic level in the corresponding page buffer, and when the test set signal inputted to the data control unit is enabled among the first and second test set signals TSET<0:1>, the data control unit performs a control operation to store the write data of the first logic level in the corresponding page buffer. For example, when the reset signal RST is enabled, the odd-numbered data control units 202_2K−1 control respective odd-numbered pages buffers 100_2K−1, where 1≤K≤N/2 to store the write data of a logic high level in the odd-numbered page buffers 100_2K−1. When any one of the first test set signal TSET<0> and the set signal SET is enabled, the odd-numbered data control units 202_2K−1 may perform a control operation to store the write data of a logic low level in the corresponding odd-numbered page buffers 100_2K−1.

When the reset signal RST is enabled (that is, activated), the even-numbered data control units 202_2K control the even-numbered page buffers 100_2K to store the write data of a logic high level in the even-numbered page buffers 100_2K, which are page buffers corresponding to the even-numbered data control units 202_2K, where 1≤K≤N/2. When any one of the second test set signal TSET<1> and the set signal SET is enabled, the even-numbered data control units 202_2K may control the corresponding even-numbered page buffers 100_2K to store the write data of a logic low level in the corresponding even-numbered page buffers 100_2K.

Figure 3:
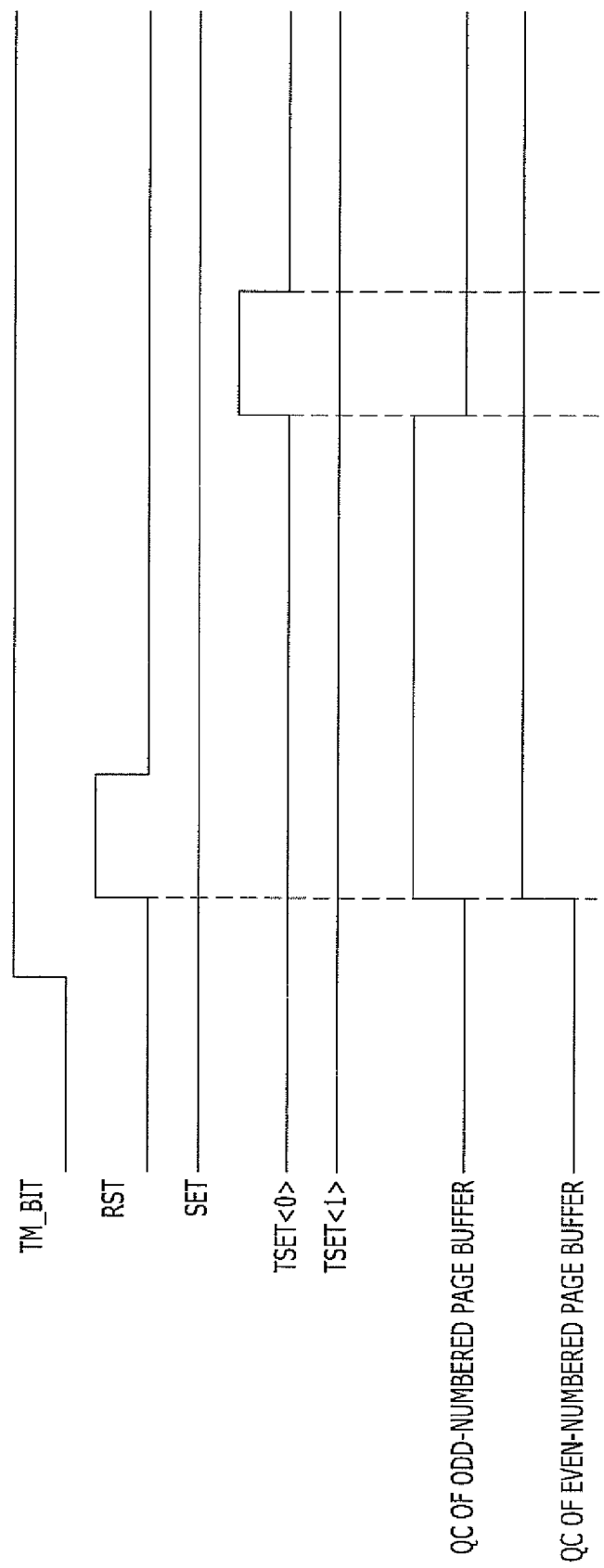
FIG. 3 is a timing diagram illustrating an operation of generating write data and programming the write data in memory cells during a test operation of the non-volatile memory device shown in FIG. 2.

FIG. 3 is a timing diagram illustrating an operation of generating write data and programming the write data in memory cells during a test operation of the non-volatile memory device shown in FIG. 2.

In the test mode, the test signal TM_BIT is in a logic high level.

The reset signal RST transitions to a logic high level in the initial duration of a test operation.

Each of the N data control units 202_1 to 202_N controls storage of the write data of a logic high level in the page buffer corresponding to the data control unit in response to the reset signal RST of the logic high level. Thus, write data of a logic high level are loaded on the latch nodes QC of the N page buffers 100_1 to 100_N.

Meanwhile, the set signal SET may be inputted in a logic low level in the test mode, which is indicated by the test signal TM_BIT being in a logic high level.

The test set signal generation unit 201A generates the first and second test set signals TSET<0:1> and enables any one of the first test set signal TSET<0> and the second test set signal TSET<1> by decoding the $M^{th}$ address bit ADD<M> of the address ADD<1:M>. Hereinafter, for illustration purposes, it is assumed that the test set signal generation unit 201A is designed to generate the first and second test set signals TSET<0:1> as shown in Table 1 by decoding the $M^{th}$ address bit ADD<M> when the $M^{th}$ address bit ADD<M> is inputted to the test set signal generation unit 201A in a logic high level. In short, the test set signal generation unit 201A generates the first test set signal TSET<0> of a logic high level and the second test set signal TSET<1> of a logic low level by decoding the $M^{th}$ address bit ADD<M> of a logic high level.

Here, the first test set signal TSET<0> is inputted to the odd-numbered data control units 202_2K-1 among the N data control units 202_1 to 202_N, and the second test set signal TSET<1> is inputted to the even-numbered data control units 202_2K.

The odd-numbered data control units 202_2K-1 controls a storage of the write data of a logic low level in the corresponding page buffers, which are the odd-numbered page buffers 100_2K-1, in response to the first test set signal TSET<0> of a logic high level. In short, the write data of a logic low level are loaded on the latch nodes QC of the odd-numbered page buffers 100_2K-1.

Meanwhile, since both the set signal SET and second test set signal TSET<1> are in the logic low level, the even-numbered data control units 202_2K do not change the level of the write data stored in the corresponding page buffers, which are the even-numbered page buffers 100_2K. Therefore, the write data loaded on the latch node QC of the even-numbered data control units 202_2K maintain the logic high level.

In short, the odd-numbered page buffers 100_2K-1 store the write data of a logic low level, and the even-numbered page buffers 100_2K store the write data of a logic high level. The write data stored in the N page buffers 100_1 to 100_N are transferred to the N bit lines BL1 to BLN that correspond to the N page buffers 100_1 to 100_N, respectively, and the write data loaded on the N bit lines BL1 to BLN are programmed in the memory cells (not shown) coupled with the N bit lines BL1 to BLN. Thus, data of '01010101. . . ' are programmed in the N memory cells (not shown).

Meanwhile, when it is assumed that the $M^{th}$ address bit ADD<M> of a logic low level is inputted to the test set signal generation unit 201A, the test set signal generation unit 201A generates a first test set signal TSET<0> of a logic low level and a second test set signal TSET<1> of a logic high level in opposite of the signal levels shown in FIG. 3. Thus, the odd-numbered page buffers 100_2K-1 store the write data of a logic high level, and the even-numbered page buffers 100_2K store the write data of a logic low level, which is the opposite to the above-described operation. Thus, data of '10101010. . . ' are programmed in the N memory cells (not shown).

Figure 4:
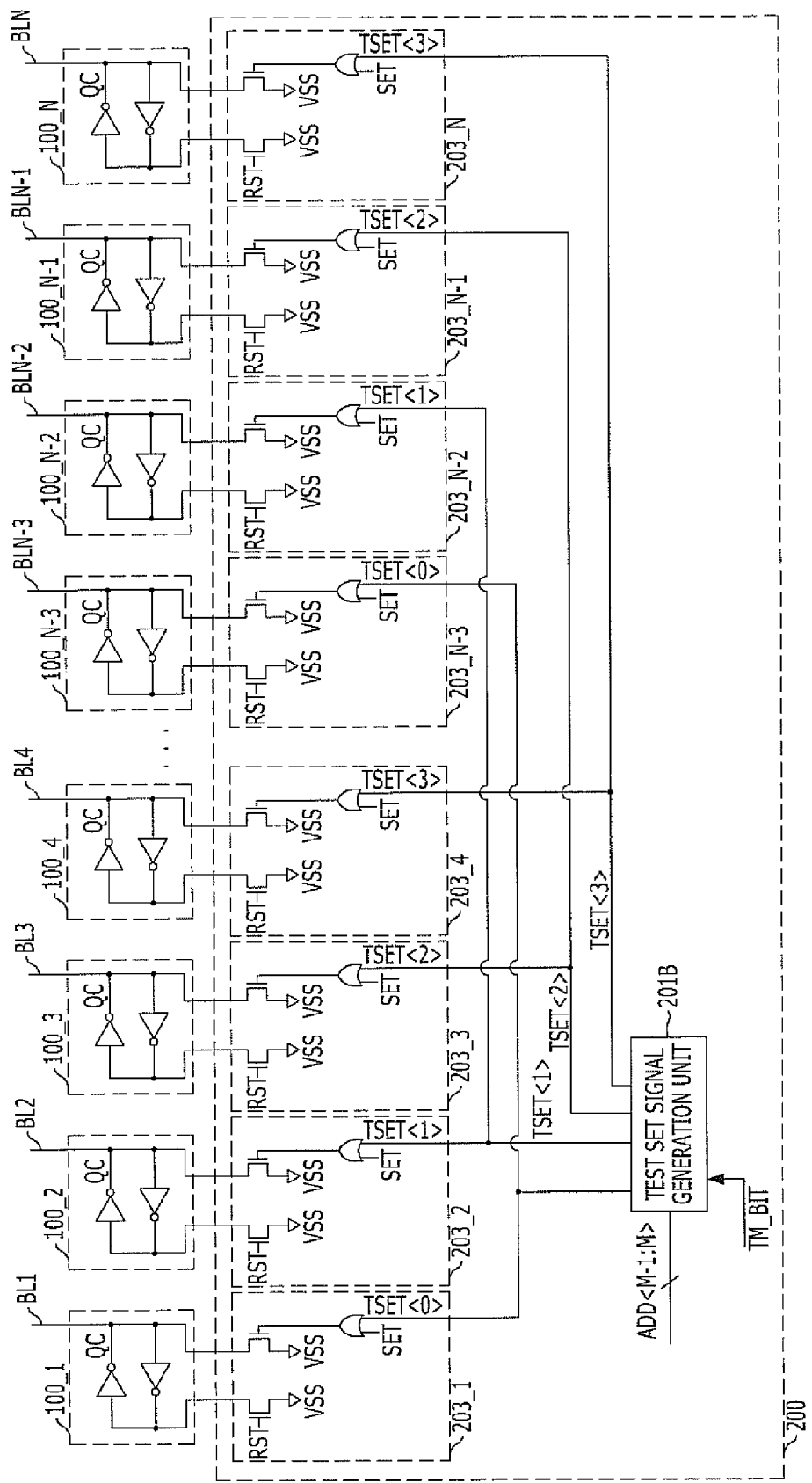
FIG. 4 illustrates a non-volatile memory device in accordance with another embodiment of the present invention.

FIG. 4 illustrates a non-volatile memory device in accordance with another embodiment of the present invention. The non-volatile memory device of FIG. 4 selects one page buffer among four page buffers based on two address bits ADD<M-1:M> of the address ADD<1:M> so that the level of the write data stored in the selected page buffers is different from the level of the write data stored in the other three page buffers.

The non-volatile memory device may include N bit lines BL1 to BLN, N page buffers 100_1 to 100_N, and a control circuit 200.

The structure and operation principle of the N bit lines BL1 to BLN are the same as the N bit lines BL1 to BLN described in FIG. 2.

The structure and operation principle of the N page buffers 100_1 to 100_N are the same as the N page buffers 100_1 to 100_N described in FIG. 2.

The control circuit 200 controls page buffers selected based on certain address bits ADD<M-1:M> of an address ADD<1:M> to store a write data of a first logic level among the N page buffers 100_1 to 100_N and controls the other page buffers to store a write data of a second logic level. The control circuit 200 may include a test set signal generation unit 201B and N data control units 203_1 to 203_N.

The test set signal generation unit 201B generates first to fourth test set signals TSET<0:3>, and in a test mode, for which a test signal TM_BIT is in a logic high level, the test set signal generation unit 201B decodes the two address bits ADD<M-1:M> of the address ADD<1:M> to enable any one among the first to fourth test set signals TSET<0:3>. For illustration purposes, FIG. 4 shows a case where the test set signal generation unit 201B decodes the M-$1^{th}$ address bit ADD<M-1> and $M^{th}$ address bit ADD<M> of the address ADD<1:M>. For example, the test set signal generation unit 201B may be designed to generate the first to fourth test set signals TSET<0:3> as shown in Table 2 by decoding the two address bits ADD<M-1:M>.

TABLE 2

Example of first to fourth test set signals TSET<0:3> that are generated by decoding address bits ADD<M-1:M>

| ADD<M-1:M> | TSET<0> | TSET<1> | TSET<2> | TSET<3> |
|---|---|---|---|---|
| 00 | 1 | 0 | 0 | 0 |
| 01 | 0 | 1 | 0 | 0 |
| 10 | 0 | 0 | 1 | 0 |
| 11 | 0 | 0 | 0 | 1 |

Meanwhile, the test set signal generation unit 201B may be designed to perform an operation to generate and activate the first to fourth test set signals TSET<0:3> in the test mode, where the test signal TM_BIT is in a logic high level. Further, the test set signal generation unit 201B may be designed to generate the first to fourth test set signals TSET<0:3> of a logic low level in the normal mode, where the test signal TM_BIT is in a logic low level.

The N data control units 203_1 to 203_N correspond to the N page buffers 100_1 to 100_N, respectively, and control the level of the write data that are stored in the corresponding N page buffers 100_1 to 100_N. To be specific, when a reset signal RST is activated, each of the N data control units 203_1 to 203_N performs a control to store the write data of the second logic level in the corresponding page buffer, and when the test set signal inputted to the control unit is activated among the first to fourth test set signals TSET<0:3>, the data control unit controls the corresponding page buffer to store the write data of the first logic level in the corresponding page buffer.

For example, when the reset signal RST is enabled, the $(4P+1)^{th}$ data control unit 203_4P+1, where 0≤P<N/4, among the N data control units 203_1 to 203_N performs a control to store the write data of a second logic level in the corresponding page buffer, which is a $(4P+1)^{th}$ page buffer 100_4P+1. When any one of the first test set signal TSET<0> and the set signal SET is enabled, the $(4P+1)^{th}$ data control unit 203_4P+1, where 0≤P<N/4, may perform a control to store the write data of a first logic level in the $(4P+1)^{th}$ page buffer 100_4P+1 corresponding to the data control unit. To be specific, when the reset signal RST is in a logic high level, the $(4P+1)^{th}$ data control unit 203_4P+1 controls the $(4P+1)^{th}$ page buffer 100_4P+1 to store the write data of a logic high level in the $(4P+1)^{th}$ page buffer 100_4P+1. When any one of the first test set signal TSET<0> and the set signal SET is in a logic high level, the $(4P+1)^{th}$ data control unit 203_4P+1 controls the corresponding $(4P+1)^{th}$ page buffer 100_4P+1 to store the write data of a logic low level in the corresponding $(4P+1)^{th}$ page buffer 100_4P+1.

When the reset signal RST is enabled, the $(4P+2)^{th}$ data control unit 203_4P+2, where 0≤P<N/4, among the N data control units 203_1 to 203_N controls a storage of the write data of the second logic level in the corresponding page buffer, which is a $(4P+2)^{th}$ page buffer 100_4P+2. When any one of the second test set signal TSET<1> and the set signal SET is enabled, the $(4P+2)^{th}$ data control unit 203_4P+2, where 0≤P<N/4, may control the corresponding $(4P+2)^{th}$ page buffer 100_4P+2 to store the write data of the first logic level in the $(4P+2)^{th}$ page buffer 100_4P+2. The structure and operation principle of the $(4P+2)^{th}$ data control unit 203_4P+2 are similar to those of the $(4P+1)^{th}$ data control unit 203_4P+1, except that the second test set signal TSET<1> is used instead of the first test set signal TSET<0>.

When the reset signal RST is enabled, the $(4P+3)^{th}$ data control unit 203_4P+3, where 0≤P<N/4, among the N data control units 203_1 to 203_N controls a storage of the write data of the second logic level in the corresponding page buffer, which is a $(4P+3)^{th}$ page buffer 100_4P+3. When any one of the third test set signal TSET<2> and the set signal SET is enabled, the $(4P+3)^{th}$ data control unit 203_4P+3, where 0≤P<N/4, may control a storage of the write data of the first logic level in the $(4P+3)^{th}$ page buffer 100_4P+3 corresponding to the data control unit. The structure and operation principle of the $(4P+3)^{th}$ data control unit 203_4P+3 are similar to those of the $(4P+1)^{th}$ data control unit 203_4P+1, except that the third test set signal TSET<2> is used instead of the first test set signal TSET<0>.

When the reset signal RST is enabled, the $(4P+4)^{th}$ data control unit 203_4P+4, where 0≤P<N/4, among the N data control units 203_1 to 203_N controls a storage of the write data of the second logic level in the corresponding page buffer, which is a $(4P+4)^{th}$ page buffer 100_4P+4. When any one of the fourth test set signal TSET<3> and the set signal SET is enabled, the $(4P+4)^{th}$ data control unit 203_4P+4, where 0≤P<N/4, may control a storage of the write data of the first logic level in the $(4P+4)^{th}$ page buffer 100_4P+4 corresponding to the data control unit. The structure and operation principle of the $(4P+4)^{th}$ data control unit 203_4P+4 are similar to those of the $(4P+1)^{th}$ data control unit 203_4P+1, except that the fourth test set signal TSET<3> is used instead of the first test set signal TSET<0>.

For example, when the control circuit 200 includes 16 data control units 203_1 to 203_16, 16 data control units 203_1 to 203_16 may be designed as follows. When the reset signal RST is in a logic high level, the first, fifth, ninth and $13^{th}$ data control units 203_1, 203_5, 203_9 and 203_13 controls a storage of the write data of a logic high level in the first, fifth, ninth and $13^{th}$ page buffers 100_1, 100_5, 100_9 and 100_13 that correspond to the first, fifth, ninth and $13^{th}$ data control units 203_1, 203_5, 203_9 and 203_13, respectively. When any one of the set signal SET and the first test set signal TSET<0> is in a logic high level, the first, fifth, ninth and $13^{th}$ data control units 203_1, 203_5, 203_9 and 203_13 may control the first, fifth, ninth and $13^{th}$ page buffers 100_1, 100_5, 100_9 and 100_13 to store the write data of a logic low level in the first, fifth, ninth and $13^{th}$ page buffers 100_1, 100_5, 100_9 and 100_13.

When the reset signal RST is in a logic high level, the second, sixth, tenth and $14^{th}$ data control units 203_2, 203_6, 203_10 and 203_14 perform a control operation to store the write data of a logic high level in the second, sixth, tenth and $14^{th}$ page buffers 100_2, 100_6, 100_10 and 100_14 that correspond to the second, sixth, tenth and $14^{th}$ data control units 203_2, 203_6, 203_10 and 203_14, respectively. When any one of the set signal SET and the second test set signal TSET<1> is in a logic high level, the second, sixth, tenth and $14^{th}$ data control units 203_2, 203_6, 203_10 and 203_14 may perform a control operation to store the write data of a logic low level in the second, sixth, tenth and $14^{th}$ page buffers 100_2, 100_6, 100_10 and 100_14.

Also, when the reset signal RST is in a logic high level, the third, seventh, $11^{th}$ and $15^{th}$ data control units 203_3, 203_7, 203_11 and 203_15 perform a control operation to store the write data of a logic high level in the third, seventh, $11^{th}$ and $15^{th}$ page buffers 100_3, 100_7, 100_11 and 100_15 that correspond to the third, seventh, $11^{th}$ and $15^{th}$ data control units 203_3, 203_7, 203_11 and 203_15, respectively. When any one of the set signal SET and the third test set signal TSET<2> is in a logic high level, the third, seventh, $11^{th}$ and $15^{th}$ data control units 203_3, 203_7, 203_11 and 203_15 may perform a control operation to store the write data of a logic low level in the third, seventh, $11^{th}$ and $15^{th}$ page buffers 100_3, 100_7, 100_11 and 100_15.

When the reset signal RST is in a logic high level, the fourth, eighth, $12^{th}$ and $16^{th}$ data control units 203_4, 203_8, 203_12 and 203_16 perform a control operation to store the write data of a logic high level in the fourth, eighth, $12^{th}$ and $16^{th}$ page buffers 100_4, 100_8, 100_12 and 100_16 that correspond to the fourth, eighth, $12^{th}$ and $16^{th}$ data control units 203_4, 203_8, 203_12 and 203_16, respectively. When any one of the set signal SET and the fourth test set signal TSET<3> is in a logic high level, the fourth, eighth, $12^{th}$ and $16^{th}$ data control units 203_4, 203_8, 203_12 and 203_16 may perform a control to store the write data of a logic low level in the fourth, eighth, $12^{th}$ and $16^{th}$ page buffers 100_4, 100_8, 100_12 and 100_16.

Since the operation of generating the write data and programming the generated write data in memory cells (not shown) during a test operation of a non-volatile memory device shown in FIG. 4 is similar to that of FIG. 3, the operation is described with reference to FIG. 3. For illustration purposes, it is assumed that the test set signal generation unit 201B generates the first to fourth test set signals TSET<0:3> as shown in Table 2 by decoding two address bits ADD<M−1:M>.

In the test mode, the test signal TM_BIT is in a logic high level.

The reset signal RST is enabled to a logic high level in the initial duration of a test operation.

Each of the N data control units 203_1 to 203_N performs a control operation to store the write data of a logic high level in the page buffer corresponding to the data control unit in response to the reset signal RST of the logic high level. After all, write data of a logic high level are loaded on the latch nodes QC of the N page buffers 100_1 to 100_N.

Meanwhile, the set signal SET may be inputted in a logic low level in the test mode, which means that the test signal TM_BIT is in a logic high level.

The test set signal generation unit 201B generates the first to fourth test set signals TSET<0:3>, and enables any one among the first to fourth test set signals TSET<0:3> by decoding two address bits ADD<M−1:M> of the address ADD<1: M>. Here, the first test set signal TSET<0> is inputted to a $(4P+1)^{th}$ data control unit 203_4P+1 among the N data control units 203_1 to 203_N, and the second test set signal TSET<1> is inputted to a $(4P+2)^{th}$ data control unit 203_4P+2 among the N data control units 203_1 to 203_N. The third test set signal TSET<2> is inputted to a $(4P+3)^{th}$ data control unit 203_4P+3 among the N data control units 203_1 to 203_N, and the fourth test set signal TSET<3> is inputted to a $(4P+4)^{th}$ data control unit 203_4P+4 among the N data control units 203_1 to 203_N. For illustration purposes, it is assumed that two address bits ADD<M−1:M> having a value of '00' are inputted to the test set signal generation unit 201B and the test set signal generation unit 201B generates a test set signal TSET<0:3> having a value of '1000'.

The $(4P+1)^{th}$ data control unit 203_4P+1 performs a control operation to store a write data of a logic low level in a $(4P+1)^{th}$ page buffer 100_4P+1 which corresponds to the $(4P+1)^{th}$ data control unit 203_4P+1 in response to a first test set signal TSET<0> of a logic high level. In short, the write data of a logic low level is loaded on the latch node QC of the $(4P+1)^{th}$ page buffer 100_4P+1.

Meanwhile, since a second test set signal TSET<1> of a logic low level is inputted to the $(4P+2)^{th}$ data control unit 203_4P+2, the $(4P+2)^{th}$ data control unit 203_4P+2 does not change the level of the write data that is stored in the $(4P+2)^{th}$ page buffer 100_4P+2. In short, the write data loaded on the latch node QC of the $(4P+2)^{th}$ page buffer 100_4P+2 maintains a logic high level.

Since a third test set signal TSET<2> of a logic low level is inputted to the $(4P+3)^{th}$ data control unit 203_4P+3, the $(4P+3)^{th}$ data control unit 203_4P+3 does not change the level of the write data. In short, the write data loaded on the latch node QC of the $(4P+3)^{th}$ page buffer 100_4P+3 maintains a logic high level.

Since a fourth test set signal TSET<3> of a logic low level is inputted to the $(4P+4)^{th}$ data control unit 203_4P+4, the $(4P+4)^{th}$ data control unit 203_4P+4 does not change the level of the write data. In short, the write data loaded on the latch node QC of the $(4P+4)^{th}$ page buffer 100_4P+4 maintains a logic high level.

Thus, the pattern of the write data that are stored in the N page buffers 100_1 to 100_N becomes '0111 0111 0111 . . . '. The write data stored in the N page buffers 100_1 to 100_N, which are '0111 0111 0111 . . . ', are transferred to N memory cells through the N bit lines BL1 to BLN and programmed in the N memory cells.

Thus, the pattern of the write data that are stored in the N page buffers 100_1 to 100_N illustrated in FIG. 4 in the test mode, which means that the test signal TM_BIT is in a logic high level is as shown in Table 3.

TABLE 3

Pattern example of write data that may be generated by decoding two address bits ADD< M-1:M>

| ADD<M-1:M> | TSET<0:3> | Pattern of Write Data |
|---|---|---|
| 00 | 1000 | 0111 0111 0111 0111 . . . |
| 01 | 0100 | 1011 1011 1011 1011 . . . |
| 10 | 0010 | 1101 1101 1101 1101 . . . |
| 11 | 0001 | 1110 1110 1110 1110 . . . |

In reference to FIG. 2, an exemplary embodiment of the present invention controls the write data stored in the odd-numbered page buffers 100_2K−1 and the write data stored in the even-numbered page buffers 100_2K to have a different value by using one address bit ADD<M> of the address ADD<1:M>. In reference to FIG. 4, another exemplary embodiment of the present invention controls the write data stored in one page buffer and the write data stored in the other page buffers among four page buffers to have a different logic value by using two address bits ADD<M−1:M> of the address ADD<1:M>. However, the exemplary embodiments are exemplary only, and a non-volatile memory device in accordance with an embodiment of the present invention may generate write data of different patterns to be stored in N page buffers 100_1 to 100_N by using different portions of the bits of an address ADD<1:M>. For example, as shown in the following Table 4, write data of different patterns may be generated by using three address bits ADD<M−2:M> of the address ADD<1:M> and stored in N page buffers 100_1 to 100_N.

TABLE 4

Pattern example of write data that are generated by decoding three address bits ADD<M-2:M>

| ADD<M-2:M> | Pattern of Write Data |
|---|---|
| 000 | 01 01 01 01 01 01 01 01 . . . |
| 001 | 10 10 10 10 10 10 10 10 . . . |
| 010 | 110 110 110 110 110 110 . . . |
| 011 | 101 101 101 101 101 101 . . . |
| 100 | 1001 1001 1001 1001 1001 . . . |
| 101 | 1011 1011 1011 1011 1011 . . . |
| 110 | 1101 1101 1101 1101 1101 . . . |
| 111 | 1111 1111 1111 1111 1111 . . . |

According to an embodiment of the present invention, since write data of diverse patterns may be generated within a non-volatile memory device by using a portion of the bits of an address ADD<1:M> and programmed in memory cells (not shown), a test operation of the non-volatile memory device may be performed within a short time by using test data of diverse patterns. Therefore, the test time for a non-volatile memory device may be reduced.

While the present invention has been described with respect to the specific embodiments, it will be apparent to those skilled in the art that various changes and modifications may be made without departing from the spirit and scope of the invention as defined in the following claims.

What is claimed is:
1. A non-volatile memory device, comprising:
a plurality of bit lines;
a plurality of page buffers corresponding to the bit lines, respectively, and configured to each store a write data; and
a control circuit configured to control at least one page buffer of the plurality of page buffers to store the write data of a first logic level and control other ones of the plurality of page buffers to store the write data of a second logic level, wherein the control circuit is further configured to select the at least one page buffer based on an address inputted to the control circuit, wherein the control circuit controls the write data stored in odd-numbered page buffers among the plurality of page buffers and the write data stored in even-numbered page buffers among the plurality of page buffers to have a different value by using one address bit of the address.

2. The non-volatile memory device of claim 1, wherein the control circuit comprises:

a test set signal generation unit configured to generate a plurality of test set signals and activate at least one of the test set signals by decoding the address in a test mode; and a plurality of data control units corresponding to the plurality of page buffers, respectively, and configured to each control the corresponding page buffer to store the write data of the first logic level when a test set signal inputted to the data control unit is activated and each control the corresponding page buffer to store the write data of the second logic level when a reset signal is activated.

3. The non-volatile memory device of claim 2, wherein the reset signal is commonly input to the data control units.

4. The non-volatile memory device of claim 1, wherein the first logic level is a logic low level and the second logic level is a logic high level.

5. The non-volatile memory device of claim 2, wherein the test set signal generation unit is configured to deactivate the test set signals in a normal mode of the non-volatile memory device.

6. The non-volatile memory device of claim 2, wherein the reset signal is a signal activated during an initial period of a test operation, and the control circuit is configured to activate at least one of the test set signals after the initial period of the test operation.

7. The non-volatile memory device of claim 1, wherein the control circuit comprises:

a test set signal generation unit configured to generate a plurality of test set signals and activate at least one of the test set signals by decoding the address in a test mode; and a plurality of data control units corresponding to the plurality of page buffers, respectively, and configured to each control the corresponding page buffer to store the write data of the first logic level when any one of a test set signal inputted to the data control unit and a set signal inputted to the data control unit is activated and each control the corresponding page buffer to store the write data of the second logic level when a reset signal is activated.

8. A non-volatile memory device, comprising:

a plurality of bit lines;

a plurality of page buffers corresponding to the plurality of bit lines, respectively, and configured to each store a write data; and a control circuit configured to control at least one page buffer of the plurality of page buffers to store the write data of a first logic level and control other ones of the plurality of page buffers to store the write data of a second logic level, wherein the control circuit is further configured to select the at least one page buffer based on a portion of bits of an address consisting of multiple bits, wherein the write data of different patterns to be stored in the plurality of page buffers by using different portions of the bits of the address are generated.

* * * * *